United States Patent
Tang et al.

(10) Patent No.: US 11,578,423 B2
(45) Date of Patent: Feb. 14, 2023

(54) MAGNET COIL FOR MAGNETIC CZOCHRALSKI SINGLE CRYSTAL GROWTH AND MAGNETIC CZOCHRALSKI SINGLE CRYSTAL GROWTH METHOD

(71) Applicant: SUZHOU BAMA SUPERCONDUCTIVE TECHNOLOGY CO., LTD, Jiangsu (CN)

(72) Inventors: Hongming Tang, Jiangsu (CN); Linjian Fu, Zhejiang (CN); Liming Liu, Zhejiang (CN); Saibo Liu, Zhejiang (CN)

(73) Assignee: Suzhou Bama Superconductive Technology Co., Ltd., Suzhou (CN)

( * ) Notice: Subject to any disclaimer, the term of this patent is extended or adjusted under 35 U.S.C. 154(b) by 209 days.

(21) Appl. No.: 16/617,073

(22) PCT Filed: Jul. 3, 2018

(86) PCT No.: PCT/CN2018/094314
§ 371 (c)(1),
(2) Date: Nov. 26, 2019

(87) PCT Pub. No.: WO2019/184128
PCT Pub. Date: Oct. 3, 2019

(65) Prior Publication Data
US 2021/0123155 A1 Apr. 29, 2021

(30) Foreign Application Priority Data
Mar. 30, 2018 (CN) .................. CN201810291309

(51) Int. Cl.
*C30B 15/20* (2006.01)
*C30B 29/06* (2006.01)
(Continued)

(52) U.S. Cl.
CPC ............. *C30B 15/20* (2013.01); *C30B 15/00* (2013.01); *C30B 29/06* (2013.01); *C30B 30/04* (2013.01); *H01F 6/06* (2013.01); *H01F 27/38* (2013.01)

(58) Field of Classification Search
CPC ....... C30B 15/00; C30B 15/20; C30B 15/305; C30B 29/06; C30B 30/04; H01F 27/38; H01F 6/06
See application file for complete search history.

(56) References Cited

U.S. PATENT DOCUMENTS 5,137,077 A * 8/1992 Sawada ................. B22D 11/115
164/466
5,868,832 A 2/1999 Begg
(Continued)

FOREIGN PATENT DOCUMENTS

CN 2401571 Y 10/2000
CN 1958875 A 5/2007
(Continued)

OTHER PUBLICATIONS

European Patent Office, English computer translation of JP 11-322486. (Year: 2022).*
(Continued)

*Primary Examiner* — Matthew J Song

(57) ABSTRACT

A magnet coil for magnetic Czochralski single crystal growth includes: a first coil, a second coil, and an auxiliary coil arranged between the first coil and the second coil. A distance between the first coil and a first edge of the auxiliary coil close to the first coil is equal to a distance between the second coil and a second edge of the auxiliary coil close to the second coil. The auxiliary coil, the first coil and the second coil have a common central axis. When being energized, a direction of a current in the first coil is opposite to a direction of a current in the second coil, and a magnetic field generated by a current in the auxiliary coil is used for enhancing a cusp magnetic field between the first coil and the second coil.

20 Claims, 4 Drawing Sheets

(51) Int. Cl.
  *C30B 30/04*  (2006.01)
  *H01F 6/06*  (2006.01)
  *H01F 27/38*  (2006.01)
  *C30B 15/00*  (2006.01)

(56) References Cited

U.S. PATENT DOCUMENTS

| | | | |
|---|---|---|---|
| 5,938,836 A * | 8/1999 | Tomioka | C30B 15/305 117/917 |
| 2005/0166600 A1* | 8/2005 | Mitsubori | F25B 9/14 62/6 |
| 2014/0053771 A1* | 2/2014 | Walter | H01F 6/04 117/217 |

FOREIGN PATENT DOCUMENTS

| | | | |
|---|---|---|---|
| CN | 101498032 A | 8/2009 | |
| CN | 101794653 A | 8/2010 | |
| CN | 103952752 A | 7/2014 | |
| CN | 105206376 A | 12/2015 | |
| JP | 11322486 A * | 11/1999 | C30B 15/22 |

OTHER PUBLICATIONS

International Search Report for International Application No. PCT/CN2018/094314 dated Jan. 7, 2019 (4 pages).

* cited by examiner

MAGNET COIL FOR MAGNETIC
CZOCHRALSKI SINGLE CRYSTAL
GROWTH AND MAGNETIC CZOCHRALSKI
SINGLE CRYSTAL GROWTH METHOD

CROSS REFERENCE TO RELATED
APPLICATIONS

This is a U.S. National Stage Application, filed under 35 U.S.C. 371, of International Patent Application No. PCT/CN2018/094314, filed on Jul. 3, 2017, which claims priority to Chinese patent application No. 201810291309.9 filed on Mar. 30, 2018, the contents of both of which are incorporated by reference herein in their entireties.

TECHNICAL FIELD

The present disclosure relates to the field of semiconductor technologies, for example, to a magnet coil for magnetic Czochralski single crystal growth and a magnetic Czochralski single crystal growth method.

BACKGROUND

With the rapid development of the manufacturing technology of semiconductor microelectronic devices, large-scale integrated circuits and other devices, the requirement for preparing semiconductor material including single crystal silicon is higher and higher. Undesired impurities and their non-uniformity in single crystal silicon are one of the main factors which restrict the improvement of the quality of single crystal silicon. Therefore, in the single crystal silicon growth, it is important to reduce defects and impurity content of the single crystal silicon and improve the distribution uniformity of dopants and impurities such as oxygen, carbon and the like in the crystal.

The single crystal silicon growth method includes a Czochralski method and a floating zone method. Currently, single crystal silicon is typically prepared by using the Czochralski method. In the Czochralski method, a single crystal rod is pulled from a melt in a single crystal growth furnace. In the Czochralski single crystal growth, the impurities are not uniform in both macroscopic and microscopic due to the thermal convection of the melt, thereby affecting physical and chemical properties of the crystals. Therefore, suppressing the thermal convection of the melt is one of the important ways to improve the quality of the single crystal silicon.

In order to solve the above problems, the magnetic Czochralski single crystal growth technology is gradually developed. On the basis of the Czochralski method, a strong magnetic field is provided outside the single crystal growth furnace to suppress the heat convection of the melt, reduce the impurity content of the crystal and improve the longitudinal and radial impurity distribution uniformity, so that high-quality single crystal silicon is obtained.

A permanent magnetic material and a conventional electromagnet is generally used in the magnetic field generating apparatus of the traditional magnetic Czochralski single crystal growth method. This magnetic Czochralski single crystal growth method is limited by the saturation magnetization of the permanent magnetic material and the power of the conventional electromagnet, so that the generated magnetic field strength is usually not high, and the suppression effect on the thermal convection of the melt does not met the expectation. With the development of superconducting magnet technologies, more and more superconducting magnets replace conventional electromagnets. The superconducting magnet can generate a stronger magnetic field, has a more evident thermal convection suppression effect on the melt, and can be used for preparing single crystal silicon with larger size or higher quality with the Czochralski process.

The magnetic field generated by the superconducting magnet in the magnetic Czochralski single crystal growth method generally includes a cusp magnetic field, a transverse magnetic field and a longitudinal magnetic field. The suppression effect of the longitudinal magnetic field on the thermal convection of the melt is not evident and is replaced by the cusp magnetic field and the transverse magnetic field.

Since the magnetic flux of the longitudinal magnetic field and the magnetic flux of the transverse magnetic field are each in a single direction, the longitudinal magnetic field and the transverse magnetic field only have a suppression effect on the part of thermal convection perpendicular to their respective magnetic fluxes, but have no suppression effect on the thermal convection parallel to their respective magnetic fluxes, and the impurity content and uniformity of the single crystal silicon are affected.

In order to further improve the quality of the single crystal, a cusp magnetic field is proposed. The cusp magnetic field includes a divergent magnetic field with radial and longitudinal components, and can effectively suppress thermal convection and forced convection generated by relative rotation of the single crystal and the crucible, thereby further improving the quality of the crystalline silicon. As the size of single crystal silicon increases, the demand for magnetic field strength increases, so that the weight and cost of the traditional magnet for generating the cusp magnetic field increase.

SUMMARY

The present application provides a magnet coil for magnetic Czochralski single crystal growth and a magnetic Czochralski single crystal growth method, which can achieve the magnetic field strength requirement of growing single crystal silicon, and can reduce the weight and cost of the traditional magnet for generating a cusp magnetic field.

The present application provides a magnet coil for magnetic Czochralski single crystal growth. The coil includes a first coil and a second coil that are opposite to each other and are arranged coaxially, and an auxiliary coil arranged between the first coil and the second coil. A distance between a first edge of the auxiliary coil close to the first coil and the first coil is equal to a distance between a second edge of the auxiliary coil close to the second coil and the second coil. A central axis of the auxiliary coil, a central axis of the first coil and a central axis of the second coil coincide. When being energized, a direction of a current in the first coil is opposite to a direction of a current in the second coil so that a cusp magnetic field is formed, and a magnetic field generated by a current in the auxiliary coil is used for enhancing the cusp magnetic field.

Optionally, the auxiliary coil includes a plurality of sub-coils, which are sequentially connected in series and form a circle along the central axis of the auxiliary coil, and a size of the circle formed by the plurality of sub-coils is the same as a size of the first coil and the same as a size of the second coil.

Optionally, the number of the plurality of sub-coils is an even number.

Optionally, adjacent sub-coils of the plurality of sub-coils are spaced apart by a predetermined distance.

Optionally, each sub-coil is a circular coil, and an end plane of each sub-coil is perpendicular to an end plane of the first coil and perpendicular to an end plane of the second coil.

Optionally, centers of all of the plurality of sub-coils are located on the same circumference, and a center of the circumference is located on the central axis of the first coil and the second coil.

Optionally, each sub-coil is an arc-shaped coil, the arc-shaped coil includes two vertical edges arranged oppositely and in parallel and two arc-shaped edges arranged oppositely and in parallel, and two ends of each vertical edge are connected to the same side ends of the two arc-shaped edges, respectively.

Optionally, a center of a circle formed by arc-shaped edges of the plurality of sub-coils is located on the central axis of the first coil and the central axis of the second coil.

Optionally, the first coil, the second coil and the auxiliary coil are made of a superconducting material.

The present application further provides a magnetic Czochralski single crystal growth method. The method includes steps described below.

The magnet coil described above is arranged outside a single crystal growth furnace and is energized.

A heater is arranged in the single crystal growth furnace, and a crucible containing a melt is placed in the heater and heated, so that the crystal block in the crucible is melted into a melt, where a fluid surface of the melt is located in a central plane of the auxiliary coil in the magnet coil described above.

Single crystal silicon is obtained by using a Czochralski method.

According to the present application, the first coil and the second coil are coaxially arranged, and the currents of the first coil and the second coil are in opposite directions, so that a cusp magnetic field is formed. Meanwhile, the auxiliary coil is added between the first coil and the second coil. On the basis of a pair of coaxial coils whose currents are in opposite directions, the magnetic field generated by the auxiliary coil and the magnetic field generated by the pair of coils whose currents are in opposite directions are superimposed, thereby strengthening the strength of the magnetic field, improving the quality of single crystal silicon, reducing the weight of the magnet, and saving the manufacturing cost.

Figure 1:
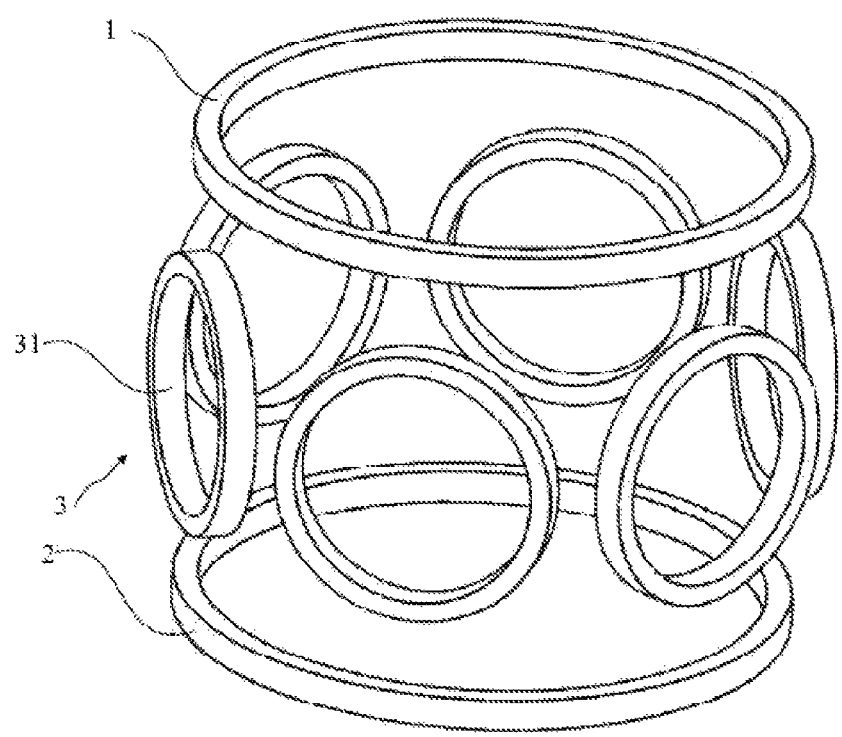
FIG. 1 is a structural diagram of a magnet coil for magnetic Czochralski single crystal growth according to Embodiment 1.

In the drawings:
10. Single crystal growth furnace; 20. Crucible; 1. First coil; 2. Second coil; 3. Auxiliary coil; 31. Sub-coil; 4. Cryogenic vessel; 5. Iron shield.

DETAILED DESCRIPTION

The distribution of magnetic fluxes of the cusp magnetic field is vertically symmetrical. The magnetic field strength of the traditional cusp magnetic field is much lower than the magnetic field strength of a transverse magnetic field (20% to 50% of the magnetic field strength of the transverse magnetic field) due to the coil power of the traditional cusp magnetic field or the huge repulsive force among coils. However, the transverse magnetic field destroys the symmetry of the original transverse thermal convection of the Czochralski growth system, which causes severe radial segregation and growth striations of the single crystal silicon rod. However, the magnetic field generated by the magnet of the cusp magnetic field is low, so that the quality of the prepared single crystal silicon generated by the cusp magnetic field is often similar as that generated by the magnet adopting the transverse magnetic field. Therefore, improving the magnetic field of the cusp magnet is a method for effectively improving the quality of the single crystal silicon. Generally, the strength of the magnetic field of the cusp magnet at the fluid level of the melt of the side wall of the crucible is required to be 2000-4000 Gauss (GS).

An embodiment provides a magnet coil for magnetic Czochralski single crystal growth. As shown in FIG. 1, the coil includes a first coil 1 and a second coil 2 that are opposite to each other and are arranged coaxially, and an auxiliary coil 3 arranged between the first coil 1 and the second coil 2. A distance between a first edge of the auxiliary coil 3 close to the first coil 1 and the first coil 1 is equal to a distance between a second edge of the auxiliary coil 3 close to the second coil 2 and the second coil 2, and a central axis of the auxiliary coil 3, a central axis of the first coil 1 and a central axis of the second coil 2 coincide. When being energized, a direction of a current in the first coil 1 is opposite to a direction of a current in the second coil 2 so that a cusp magnetic field is formed, and a magnetic field generated by a current in the auxiliary coil 3 is used for enhancing the cusp magnetic field.

According to the present application, the first coil 1 and the second coil 2 are coaxially arranged and their currents are in opposite directions, such that a cusp magnetic field including radial and longitudinal magnetic field components is formed, and meanwhile, the auxiliary coil 3 is added between the first coil 1 and the second coil 2. On the basis of a pair of coaxial coils whose currents are in opposite directions, the magnetic field generated by the auxiliary coil 3 and the magnetic field generated by the pair of coils are superimposed, thereby strengthening the strength of the magnetic field. In addition, the uniformity of the magnetic field may be adjusted by adjusting the auxiliary coil 3 and the current of the auxiliary coil 3, so that the suppression of the thermal convection of the melt in the single crystal furnace 10 is consistent, the prepared single crystal silicon has high purity, the impurity distribution in the single crystal silicon is more uniform, and the quality of the single crystal silicon is improved.

In an embodiment, the first coil 1 may be arranged above the second coil 2. The distance between the first edge of the auxiliary coil 3 close to the first coil 1 and the first coil 1 is equal to the distance between the second edge of the auxiliary coil 3 close to the second coil 2 and the second coil 2, so that the magnetic field strength at the axial zero magnetic plane formed by the first coil 1 and the second coil 2 is increased, and the quality of single crystal silicon is improved.

In an embodiment, the gap between the auxiliary coil 3 the first coil 1 is equal to the gap between the auxiliary coil 3 and the second coil 2.

The auxiliary coil 3 includes two or more sub-coils 31. The sub-coils 31 are connected in series in sequence, and are arranged at intervals, that is, adjacent sub-coils 31 among the plurality of sub-coils 31 are spaced apart by a predetermined distance. In an embodiment, the number of sub-coils 31 is not limited in the embodiment and may be adjusted according to actual production requirements to adjust the uniformity of the magnetic field, so that the thermal convection of the melt in the single crystal growth furnace 10 is consistently suppressed, the prepared single crystal silicon has high purity, the impurity distribution in the single crystal silicon is more uniform, and the quality of the single crystal silicon is improved. In addition, the plurality of sub-coils 31 are uniformly arranged in a circumference whose central axis is the central axis of the auxiliary coil 3 to further ensure the uniformity of the magnetic field. In an embodiment, the current in the sub-coil 31 may be the same as the current in the first coil 1 in magnitude and direction, or the current in the sub-coil 31 may be the same as the current in the second coil 2 in magnitude and direction, which is not limited in the embodiment.

Each sub-coil 31 is a circular coil, and the axis of a sub-coil 31 is perpendicular to the axis of the auxiliary coil 3, that is, the end plane of each sub-coil 31 is perpendicular to the end plane of the first coil 1 and perpendicular to the end plane of the second coil 2, and the centers of all of the plurality of sub-coils 31 are located on the same circumference whose center is located on the central axis of the first coil 1 and the second coil 2.

The first coil 1, the second coil 2 and the auxiliary coil 3 are made of a superconducting material. In the embodiment, the first coil 1, the second coil 2 and the auxiliary coil 3 are superconducting coils, and are in a superconducting state when being placed a low-temperature environment, and can undergo a current higher than the current of a conventional coil, such that a higher magnetic field is generated, thereby ensuring the quality of single crystal silicon during manufacturing.

Figure 2:
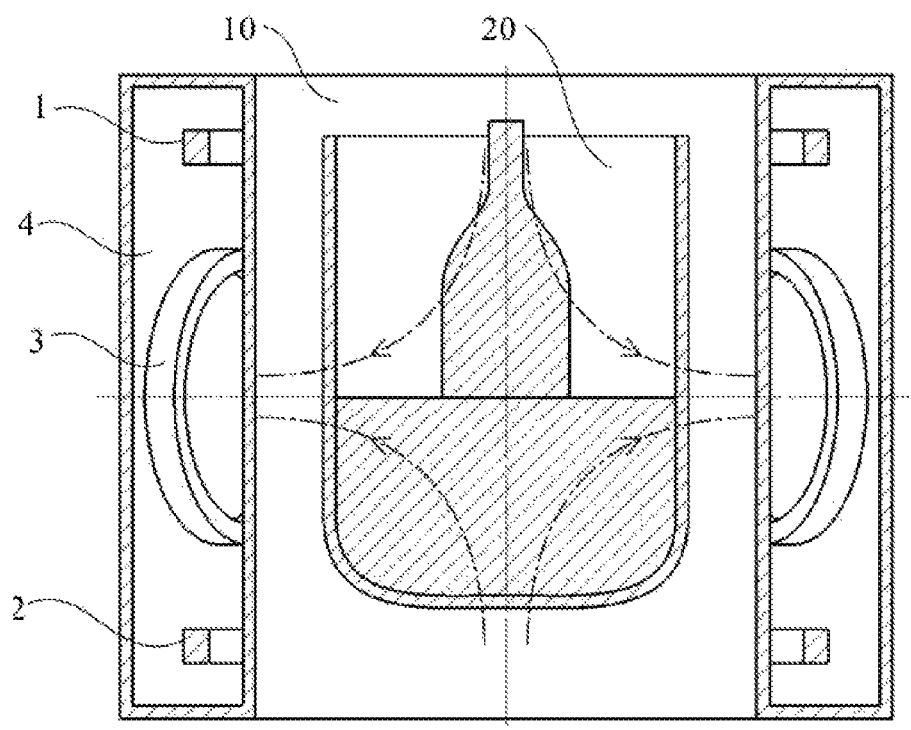
FIG. 2 is a sectional view of a magnet coil and a single crystal growth furnace for magnetic Czochralski single crystal growth according to Embodiment 1.

As shown in FIG. 2, the first coil 1, the second coil 2, and the auxiliary coil 3 are all located outside the single crystal growth furnace 10.

Figure 3:
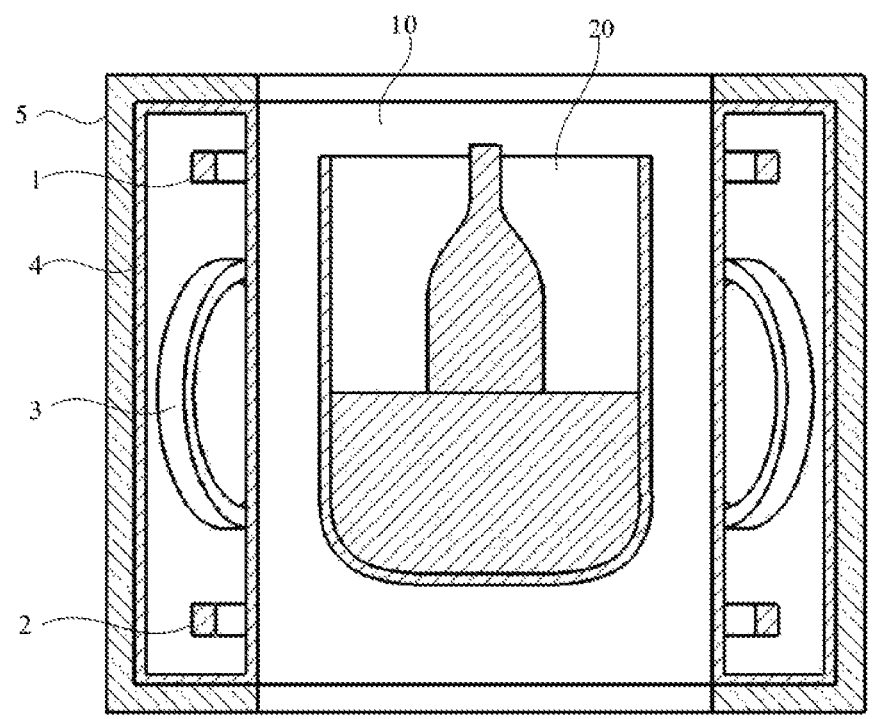
FIG. 3 is a schematic diagram of a magnet coil for magnetic Czochralski single crystal growth with a ferromagnet provided outside thereof according to Embodiment 1.

As shown in FIGS. 2 and 3, the coil further includes a cryogenic container 4 arranged outside the single crystal growth furnace 10, and the first coil 1, the second coil 2, and the auxiliary coil 3 are all arranged inside the cryogenic container 4. The cryogenic container 4 is filled with cryogenic liquid, and the coil is arranged in the cryogenic liquid. In an embodiment, a vacuum compartment is arranged in the cryogenic container 4, and the cryogenic container 4 is further provided with a vacuum valve (not shown in the figure). After the coil is energized, the vacuum valve can provide a vacuum environment surrounding the cryogenic liquid, achieving the heat insulation effect and keeping the cryogenic liquid in a zero-consumption state. The cryogenic liquid is liquid helium, and the vacuum compartment is a liquid helium Dewar. In an embodiment, the cooling liquid and the vacuum compartment in the embodiment may be implemented in other manners. The coil is cooled by the cryogenic liquid or may be directly cooled by a refrigerator, and the like, which is not limited in the embodiment.

In addition, the coil provided in the embodiment may further include an iron shield 5, where the iron shield 5 coats the external surface of the cryogenic container 4, reduces the influence of the leakage magnetic field on the single crystal growth furnace 10 device, meets the magnetic field requirements for human safety, further increases the magnetic field strength at the fluid level of the melt and improves the quality of the single crystal silicon.

An embodiment further provides a magnetic Czochralski single crystal growth method. The magnetic Czochralski single crystal growth method includes steps described below.

Step 1: The magnet coil described above is arranged outside a single crystal growth furnace 10, and then is energized. Energizing the magnet coil includes energizing the first coil 1, the second coil 2 and the auxiliary coil 3. When the magnet coil is energized, the currents in the first coil 1 and the second coil 2 are opposite in direction, and the magnitude of the current in each sub-coil of the auxiliary coil 3 may be either the same as the magnitude of the current in the first coil 1, or may not be the same as the magnitude of the current in the first coil 1.

Step 2: A heater is arranged in the single crystal growth furnace 10, and a crucible 20 with a crystal block is placed in the heater and is heated, so that the crystal block in the crucible 20 is melted into a melt, where a fluid level of the melt is located in a central plane of the auxiliary coil 3. The crystal block is heated to be in a molten state to form the melt. The cusp magnetic field provided by the first coil 1, the second coil 2 and the auxiliary coil 3 acts on the melt, the suppression of melt thermal convection in the single crystal growth furnace 10 by the melt under the action of a uniform magnetic field is consistent, so that the prepared single crystal silicon has a very high purity, the impurity distribution in the single crystal silicon is more uniform, and the quality of the single crystal silicon is improved.

Step 3: Single crystal silicon is obtained by using a Czochralski method. The magnetic field of the superconducting magnet for obtaining the single crystal with the Czochralski method is required to be 2000-5000 GS at the fluid level of the melt at the side wall of the crucible 20. The higher the magnetic field strength, the more effective the suppression on the melt thermal convection, and the prepared single crystal silicon is better in quality. Under the action of a strong magnetic field, the thermal convection and the forced convection generated by the relative rotation of the single crystal and the crucible 20 can be effectively suppressed, so that the quality of the single crystal silicon is further improved.

The Czochralski method refers to that after the melt is heated to be in a molten state, a chemically etched seed crystal is lowered and rotated so that the seed crystal is in contact with the melt, and that the melt crystallizes and grows on the seed crystal until the single crystal silicon with a certain diameter is obtained.

Embodiment 2

Figure 4:
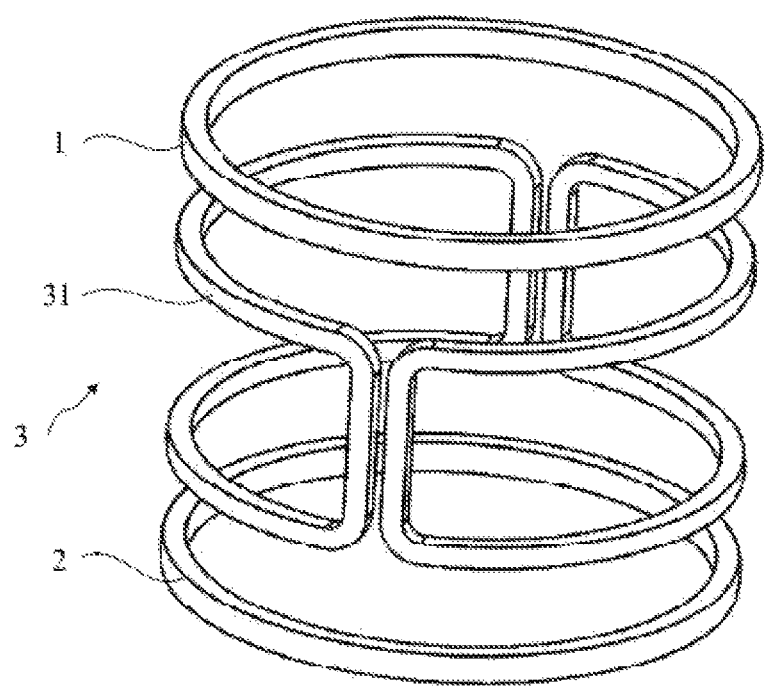
FIG. 4 is a structural diagram of a magnet coil for magnetic Czochralski single crystal growth according to Embodiment 2.

The embodiment provides a magnet coil for magnetic Czochralski single crystal growth, and also provides another type of sub-coil 31, which is an arc-shaped coil as shown in FIG. 4.

Each arc-shaped coil includes two vertical edges arranged oppositely and in parallel and two arc-shaped edges arranged oppositely and in parallel, two ends of each vertical edge are connected to the same side ends of the two arc-shaped edges, respectively, and the center of a circle formed by the arc-shaped edges of the plurality of sub-coils 31 is located on the central axis of the first coil 1 and the second coil 2.

Optionally, the number of sub-coils 31 in the embodiment is two, and the two arc-shaped sub-coils 31 form a circular coil having two openings. In another embodiment, the number of sub-coils 31 may further be four or six, and the number of sub-coils 31 is not limited in the embodiment and may be adjusted according to actual needs.

In an embodiment, the sub-coil 31 may also be solenoidal, elliptical, or the like, and the number of coils may be adjusted according to the requirement of the magnetic field strength in the single crystal silicon growth, which is not limited.

Other structures in the embodiment are the same as other structures in Embodiment 1, and will not be described here.

According to the embodiment, an auxiliary coil is arranged for adjusting and optimizing the magnetic field, the uniformity of the magnetic field can be adjusted, so that the suppression of the thermal convection of the melt in the single crystal furnace is consistent, the prepared single crystal silicon has high purity, and the impurity distribution in the single crystal silicon is more uniform; even if the original magnetic field strength remains unchanged, the weight of the magnet can be reduced and the manufacturing cost can be saved by reducing the number of the superconducting coils and reducing the repulsive force among the coils.

What is claimed is:

1. A magnet coil for magnetic Czochralski single crystal growth, comprising:
    a first coil;
    a second coil, the second coil and the first coil are opposite to each other and coaxially arranged; and
    an auxiliary coil comprising a plurality of sub-coils disposed between the first coil and the second coil, wherein
        a first distance between the first coil and a first edge of the auxiliary coil close to the first coil is equal to a second distance between the second coil and a second edge of the auxiliary coil close to the second coil, wherein each of the plurality of sub-coils has a plane perpendicular to first and second coil planes, and
        an auxiliary coil central axis of the auxiliary coil, and a first coil central axis of the first coil and a second coil central axis of the second coil coincide; and
    wherein when the coil is energized,
        a first coil current flows through the first coil in a first coil current flow direction,
        a second coil current flows through the second coil in a second coil current direction, the first and second coil current flow directions are opposite current flow directions,
        an auxiliary coil current flows through the auxiliary coil in an auxiliary coil current flow direction,
        a cusp magnetic field is formed by the first and second coil currents, and
        an auxiliary magnetic field generated by the auxiliary coil current in the auxiliary coil enhances the cusp magnetic field.

2. The coil of claim 1, wherein the plurality of sub-coils are sequentially connected in series and form a circle with respect to the central axis of the auxiliary coil, and a size of the circle formed by the plurality of sub-coils is the same as a size of the first coil and the same as a size of the second coil.

3. The coil of claim 2, wherein a number of the plurality of sub-coils is an even number.

4. The coil of claim 3, wherein adjacent sub-coils of the plurality of sub-coils are spaced apart by a predetermined distance.

5. The coil of claim 2, wherein adjacent sub-coils of the plurality of sub-coils are spaced apart by a predetermined distance.

6. The coil of claim 5, wherein each of the plurality of sub-coils is a circular coil, and an end plane of the each of the plurality of sub-coils is perpendicular to an end plane of the first coil and perpendicular to an end plane of the second coil.

7. The coil of claim 5, wherein each of the plurality of sub-coils is an arc-shaped coil, the arc-shaped coil comprises two vertical edges arranged oppositely and in parallel and two arc-shaped edges arranged oppositely and in parallel, and two ends of each of the two vertical edges are connected to same side ends of the two arc-shaped edges, respectively.

8. The coil of claim 2, wherein each of the plurality of sub-coils is a circular coil, and an end plane of each of the plurality of sub-coils is perpendicular to an end plane of the first coil and perpendicular to an end plane of the second coil.

9. The coil of claim 8, wherein centers of the plurality of sub-coils are all located on a same circumference, and a center of the circumference is located on the central axis of the first coil and the second coil.

10. The coil of claim 8, wherein each of the plurality of sub-coils is a circular coil, and an end plane of the each of the plurality of sub-coils is perpendicular to an end plane of the first coil and perpendicular to an end plane of the second coil.

11. The coil of claim 2, wherein each of the plurality of sub-coils is an arc-shaped coil, the arc-shaped coil comprises two vertical edges arranged oppositely and in parallel and two arc-shaped edges arranged oppositely and in parallel, and two ends of each of the two vertical edges are connected to same side ends of the two arc-shaped edges, respectively.

12. The coil of claim 11, wherein a center of a circle formed by the arc-shaped edges of the plurality of sub-coils is located on the central axis of the first coil and the central axis of the second coil.

13. The coil of claim 1, wherein the first coil, the second coil and the auxiliary coil are made of a superconducting material.

14. The coil of claim 1 wherein an axial zero magnetic plane formed by the first and second coils is increased by the auxiliary magnetic field of the auxiliary coil.

15. The coil of claim 1 wherein the auxiliary current comprises an auxiliary current magnitude and the auxiliary current flow direction which are:
    the same as a first coil current magnitude of the first coil current and the first coil current flow direction; or
    the same as a second coil current magnitude of the second coil current and the second coil current flow direction.

16. A magnetic Czochralski single crystal growth method, comprising:
    disposing a magnet coil outside a single crystal growth furnace, wherein the magnet coil comprises
        a first coil,
        a second coil, the second coil and the first coil are opposite to each other and coaxially arranged, and
        an auxiliary coil comprising a plurality of sub-coils disposed between the first coil and the second coil, wherein a first distance between the first coil and a first edge of the auxiliary coil close to the first coil is equal to a second distance between the second coil and a second edge of the auxiliary coil close to the second coil, wherein each of the plurality of sub-coils has a plane perpendicular to the first and second coils, and an auxiliary coil central axis of the auxiliary coil, and a first coil central axis of the first coil and a second coil central axis of the second coil coincide, and wherein when the coil is energized, a first coil current flows through the first coil in a first coil current flow direction, a second coil current flows through the second coil in a second coil current direction, the first and second coil current flow directions are opposite current flow directions, an auxiliary coil current flows through the auxiliary coil in an auxiliary coil current flow direction, a cusp magnetic field is formed by the first and second coil currents, and an auxiliary magnetic field generated by the auxiliary coil current in the auxiliary coil enhances the cusp magnetic field;

energizing the magnet coil;

arranging a heater in the single crystal growth furnace;

placing a crucible carrying a crystal block in the heater and heating the crucible, so that the crystal block in the crucible is melted into a melt, wherein a fluid surface of the melt is located in a central plane of the auxiliary coil in the magnet coil; and obtaining single crystal silicon by using a Czochralski method.

17. A magnet coil for magnetic Czochralski single crystal growth, comprising:

a first coil having a first coil plane;

a second coil having a second coil plane which is parallel to the first coil plane, wherein a first coil central axis of the first coil through the first coil plane and a second coil central axis of the second coil through the second coil plane coincide into a common central axis of the first and second coils, the first and second coils are arranged in a coaxial arrangement;

an auxiliary coil disposed between the first and second coils, wherein a first gap between the auxiliary coil and the first coil is equal to a second gap between the auxiliary coil and the second coil, the auxiliary coil comprises a plurality of sub-coils, each having an auxiliary sub-coil plane which is perpendicular to the first and second coil planes and a central axis of each auxiliary sub-coil forms a sub-coil central axes plane which intersects with the central axis of the first and second coils, wherein a center of the auxiliary sub-coils is located at the common central axis of the first and second coils; and wherein when the coil is energized, a first coil current flows through the first coil in a first coil current flow direction along the first coil plane, a second coil current flows through the second coil in a second coil current direction along the second coil plane, the first and second coil current flow directions are opposite current flow directions, an auxiliary coil current flows through the auxiliary coil in an auxiliary coil current flow direction along the sub-coil planes, a cusp magnetic field is formed by the first and second coil currents, and an auxiliary magnetic field generated by the auxiliary coil current in the auxiliary coil enhances the cusp magnetic field.

18. The coil of claim 17 wherein the sub-coils comprise circular sub-coil.

19. The coil of claim 17, wherein adjacent sub-coils of the plurality of sub-coils are spaced apart by a predetermined distance.

20. The coil of claim 17 wherein the auxiliary current comprises an auxiliary current magnitude and the auxiliary current flow direction which are:

the same as a first coil current magnitude of the first coil current and the first coil current flow direction; or the same as a second coil current magnitude of the second coil current and the second coil current flow direction.

* * * * *